United States Patent
Parkin et al.

(10) Patent No.: US 12,165,683 B2
(45) Date of Patent: Dec. 10, 2024

(54) MAGNETIC MEMORY DEVICES

(71) Applicant: Samsung Electronics Co., Ltd., Suwon-si (KR)

(72) Inventors: Stuart Papworth Parkin, Halle (DE); Jaechun Jeon, Halle (DE); Andrea Migliorini, Halle (DE); Ung Hwan Pi, Hwaseong-si (KR)

(73) Assignees: Samsung Electronics Co., Ltd. (KR); Max-Planck-Gesellschaft zur Förderung der Wissenschaften e.V. (DE)

( * ) Notice: Subject to any disclaimer, the term of this patent is extended or adjusted under 35 U.S.C. 154(b) by 155 days.

(21) Appl. No.: 18/096,161

(22) Filed: Jan. 12, 2023

(65) Prior Publication Data
US 2023/0298649 A1     Sep. 21, 2023

(30) Foreign Application Priority Data

Mar. 17, 2022   (KR) ........................ 10-2022-0033478

(51) Int. Cl.
*G11C 11/16*      (2006.01)
*H10B 61/00*      (2023.01)

(52) U.S. Cl.
CPC ...... *G11C 11/1673* (2013.01); *G11C 11/1675* (2013.01); *H10B 61/00* (2023.02)

(58) Field of Classification Search
CPC .................................................... G11C 11/16
See application file for complete search history.

(56) References Cited

U.S. PATENT DOCUMENTS

| | | |
|---|---|---|
| 6,834,005 B1 | 12/2004 | Parkin |
| 7,551,469 B1 | 6/2009 | Parkin |
| 8,018,764 B2 | 9/2011 | Lee et al. |
| 8,902,626 B2 | 12/2014 | Annunziata et al. |
| 10,756,255 B2 | 8/2020 | Song et al. |
| 10,783,944 B2 | 9/2020 | Lee et al. |
| 2014/0353781 A1* | 12/2014 | Baldi ............... G11C 11/161 257/421 |
| 2021/0125653 A1 | 4/2021 | Sonobe et al. |
| 2021/0126189 A1 | 4/2021 | Sonobe et al. |

FOREIGN PATENT DOCUMENTS

KR     100900960 B1     6/2009

* cited by examiner

*Primary Examiner* — Jason Lappas
(74) *Attorney, Agent, or Firm* — Myers Bigel, P.A.

(57) ABSTRACT

A magnetic memory device includes a conductive line that extends in a first direction, and a magnetic track line that extends in the first direction on a top surface of the conductive line. The conductive line may include a first region having a first width in a second direction, and a second region having a second width in the second direction. The first direction and the second direction are parallel to the top surface of the conductive line and are perpendicular to each other. The second width may be greater than the first width. The magnetic track line includes first domains arranged in the first direction on the first region of the conductive line, and second domains arranged in the first direction on the second region of the conductive line. A size of each of the second domains may be less than a size of each of the first domains.

20 Claims, 11 Drawing Sheets

MAGNETIC MEMORY DEVICES

CROSS-REFERENCE TO RELATED APPLICATION

This U.S. non-provisional patent application claims priority under 35 U.S.C. § 119 to Korean Patent Application No. 10-2022-0033478, filed on Mar. 17, 2022, in the Korean Intellectual Property Office, and the entire contents of the above-identified application are hereby incorporated by reference.

TECHNICAL FIELD

The present disclosure relates to magnetic memory devices, and more particularly, relates to magnetic memory devices that use a movement phenomenon of a magnetic domain wall.

BACKGROUND

High-speed and low-voltage memory devices are being increasingly demanded, in part to realize high-speed and low-power electronic devices that have memory devices as components. Magnetic memory devices have been studied as a potential memory device to satisfy these demands. Some magnetic memory devices are being considered as possible next-generation memory devices because of their high-speed operation characteristics and/or non-volatile characteristics. For example, a new magnetic memory device using a movement phenomenon of a magnetic domain wall of a magnetic material is under current study and development.

SUMMARY

Some aspects of the present inventive concepts may provide magnetic memory devices capable of controlling movement speeds of domain walls in a magnetic track line.

Some aspects of the present inventive concepts may also provide magnetic memory devices capable of controlling domain widths of domains in a magnetic track line.

In some aspects, a magnetic memory device may include a conductive line that extends in a first direction, and a magnetic track line that extends in the first direction on a top surface of the conductive line. The conductive line may include a first region having a first width in a second direction, and a second region having a second width in the second direction. The first direction and the second direction may be parallel to the top surface of the conductive line and may be perpendicular to each other. The second width may be greater than the first width. The magnetic track line may include first domains arranged in the first direction on the first region of the conductive line, and second domains arranged in the first direction on the second region of the conductive line. A size of each of the second domains may be less than a size of each of the first domains.

In some aspects, a magnetic memory device may include a conductive line, and a magnetic track line extending along one surface of the conductive line. The conductive line may have a width in a direction which is parallel to the one surface of the conductive line and is perpendicular to an extension direction of the magnetic track line and the conductive line. The conductive line may include a first region having a first width, and a second region having a second width different from the first width. The magnetic track line may include first domains adjacent to the first region of the conductive line, and second domains adjacent to the second region of the conductive line. A size of each of the first domains may be different from a size of each of the second domains.

DETAILED DESCRIPTION

Some example embodiments of the inventive concepts will now be described more fully with reference to the accompanying drawings.

Figure 1:
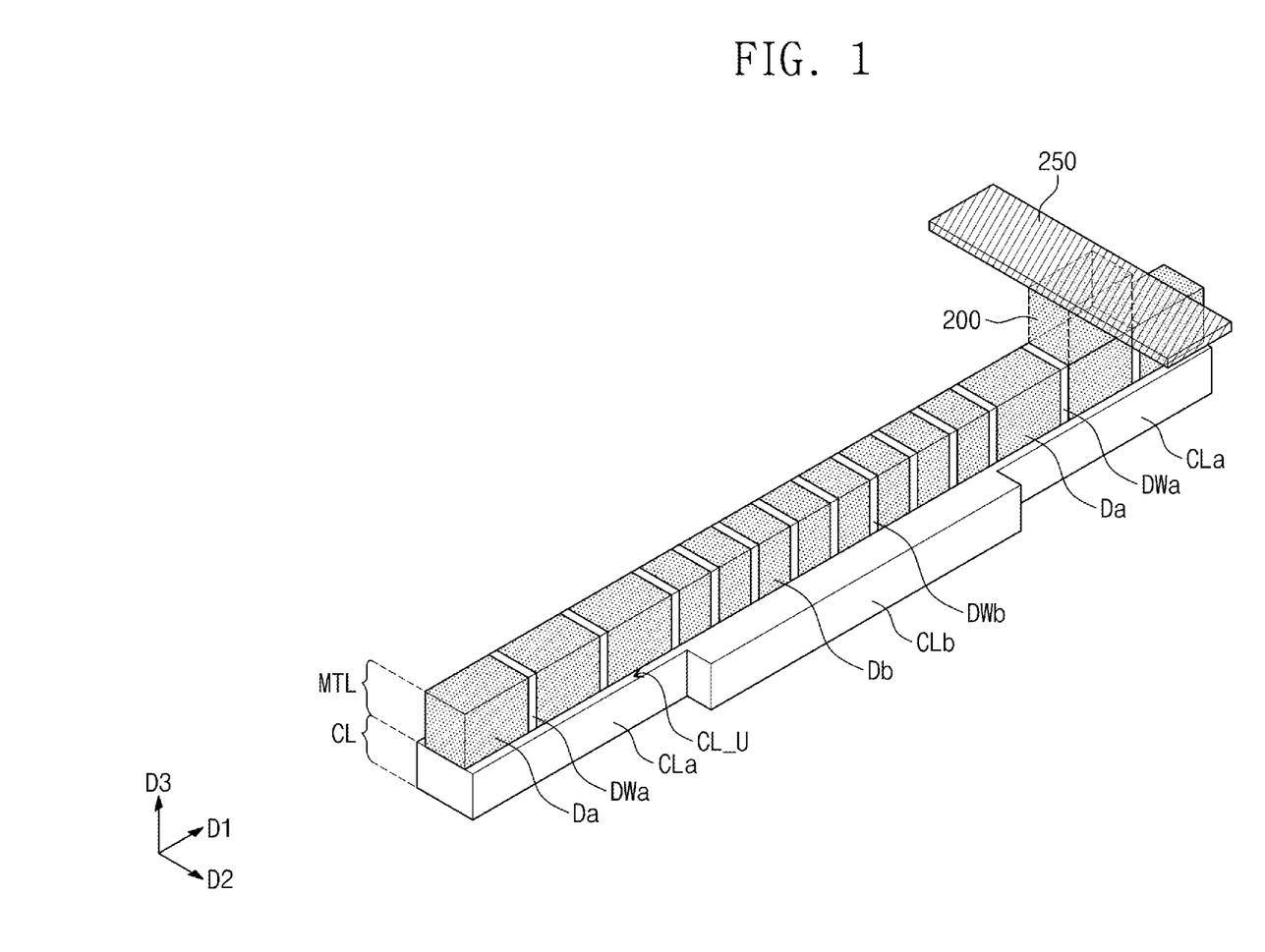
FIG. 1 is a perspective view schematically illustrating a magnetic memory device according to some embodiments of the inventive concepts.
Figure 2:
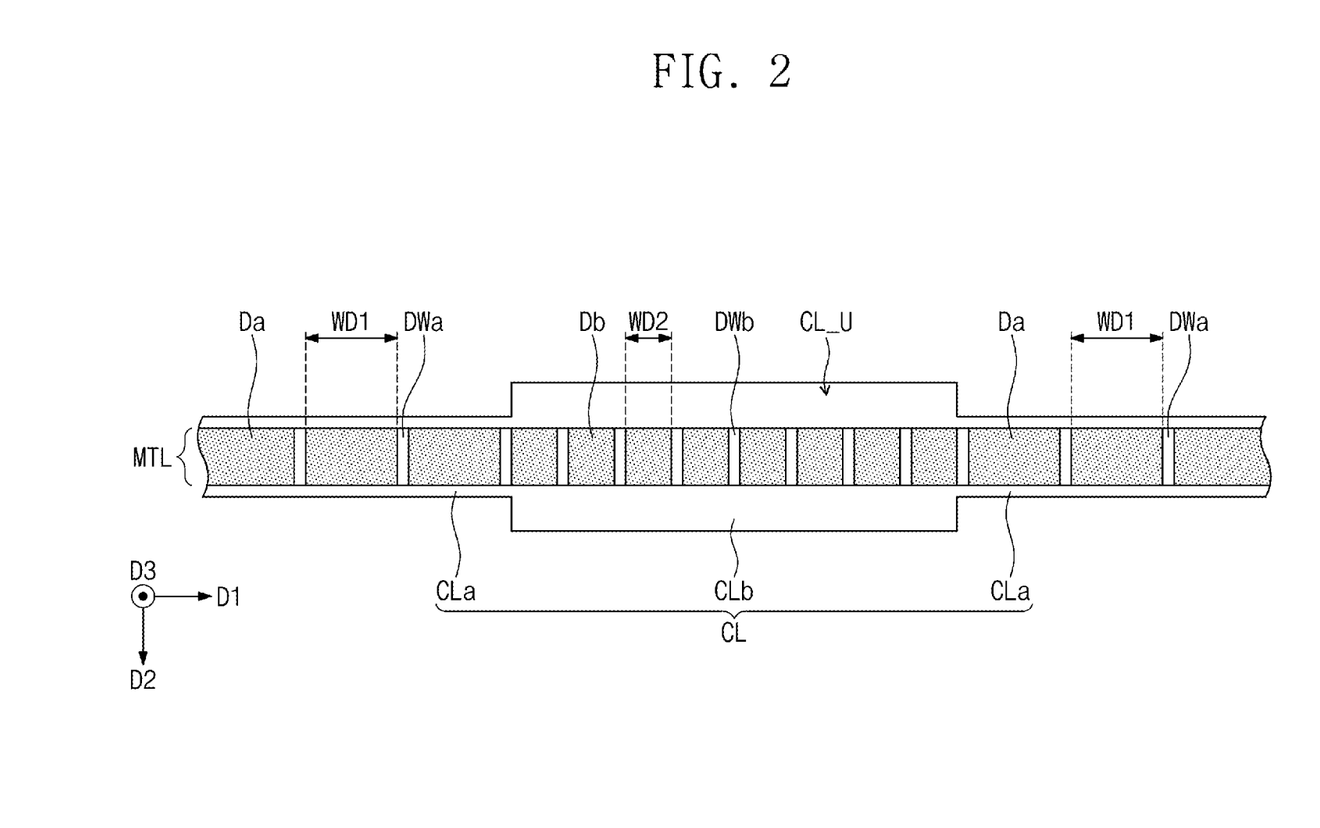
FIG. 2 is a plan view illustrating a magnetic track line and a conductive line of FIG. 1.
Figure 3:
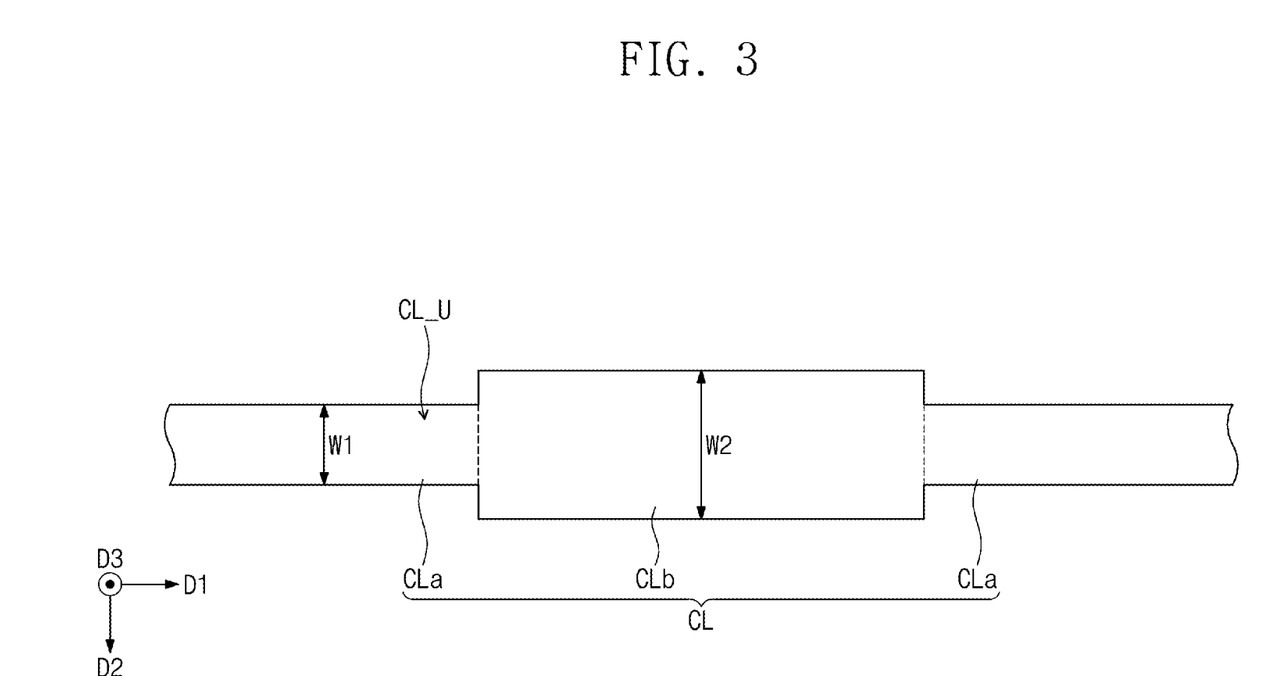
FIG. 3 is a plan view illustrating the conductive line of FIG. 1.
Figure 4:
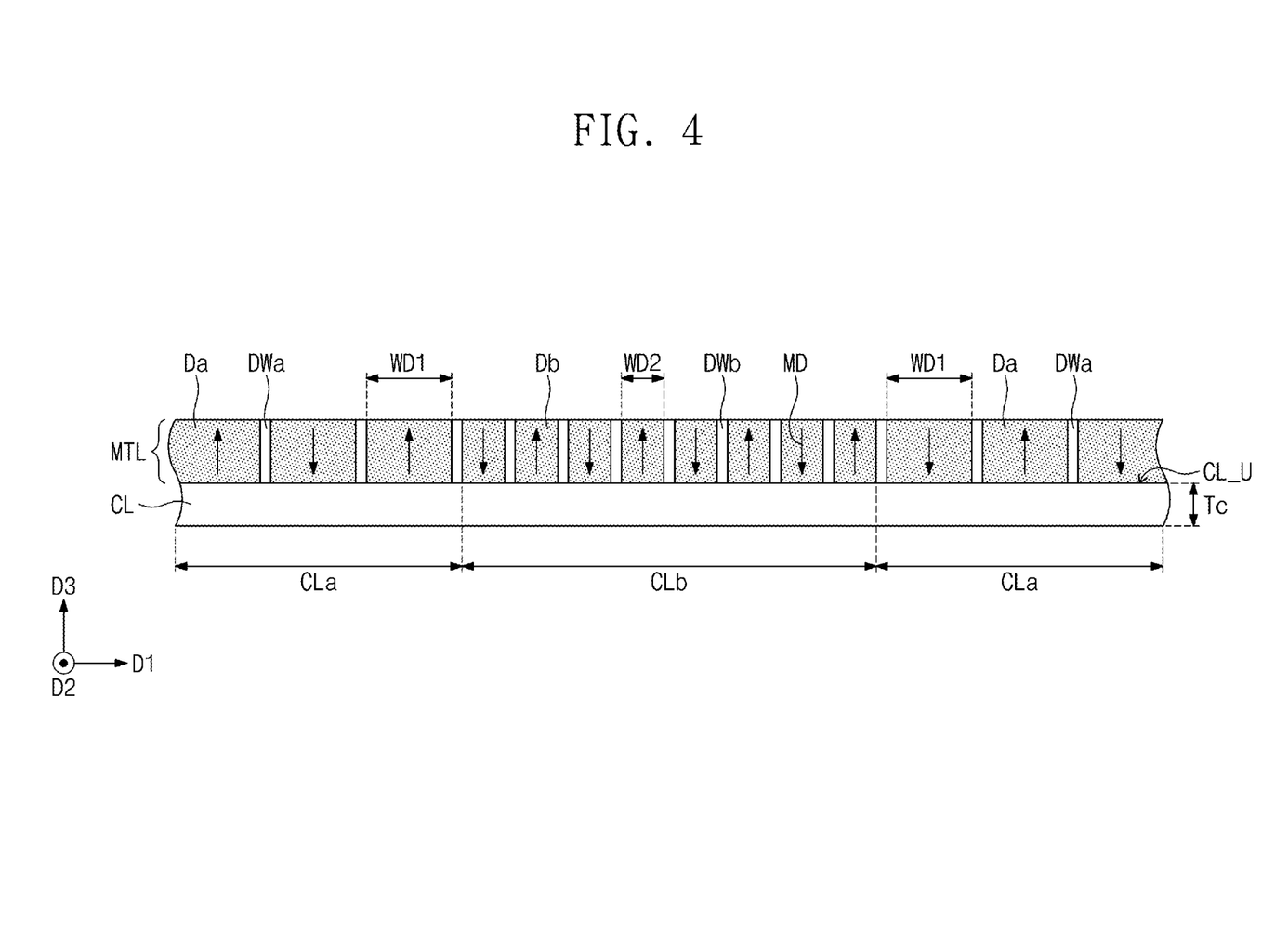
FIG. 4 is a side view illustrating the magnetic track line and the conductive line of FIG. 1.

FIG. 1 is a perspective view schematically illustrating a magnetic memory device according to some embodiments of the inventive concepts. FIG. 2 is a plan view illustrating a magnetic track line and a conductive line of FIG. 1, and FIG. 3 is a plan view illustrating the conductive line of FIG. 1. FIG. 4 is a side view illustrating the magnetic track line and the conductive line of FIG. 1.

Referring to FIG. 1, a magnetic memory device may include a conductive line CL, a magnetic track line MTL on the conductive line CL, a read/write unit 200 on the magnetic track line MTL, and an upper conductive line 250 connected to the read/write unit 200.

The magnetic track line MTL may be on a top surface CL_U of the conductive line CL, and the conductive line CL and the magnetic track line MTL may extend in length in a first direction D1 parallel to the top surface CL_U of the conductive line CL. The read/write unit 200 may be adjacent to a portion of the magnetic track line MTL, and the magnetic track line MTL may be between the read/write unit 200 and the conductive line CL. The read/write unit 200 may be between the magnetic track line MTL and the upper conductive line 250 and may be electrically connected to the upper conductive line 250. For example, the upper conductive line 250 may be on the magnetic track line MTL to intersect the magnetic track line MTL, and the read/write unit 200 may be at an intersection point of the magnetic track line MTL and the upper conductive line 250.

Referring to FIGS. 1 to 4, the conductive line CL may be configured to generate spin-orbit torque by a current flowing therein. The conductive line CL may include a material capable of generating a spin hall effect or a Rashba effect by a current flowing in a direction parallel or antiparallel to the first direction D1 in the conductive line CL. The conductive line CL may include a heavy metal having an atomic number of 30 or more and may include at least one of, for example, iridium (Ir), ruthenium (Ru), tantalum (Ta), platinum (Pt), palladium (Pd), bismuth (Bi), titanium (Ti), tungsten (W), beta-tantalum (($\beta$-Ta), or beta-tungsten ($\beta$-W).

The conductive line CL may have widths W1 and W2 in a second direction D2 which is parallel to the top surface CL_U of the conductive line CL and is perpendicular to the first direction D1. The conductive line CL may include a first region CLa having a first width W1 in the second direction D2, and a second region CLb having a second width W2 in the second direction D2. The first width W1 may be different from the second width W2. The second width W2 may be greater than the first width W 1. The conductive line CL may have a thickness Tc in a third direction D3 that is perpendicular to the top surface CL_U of the conductive line CL. A thickness Tc of the first region CLa of the conductive line CL may be substantially equal to a thickness Tc of the second region CLb of the conductive line CL. In some embodiments the conductive line CL may have a substantially uniform thickness in the third direction D3 along the length of the conductive line CL in the first direction D1.

The magnetic track line MTL may include a plurality of domains Da and Db arranged in the first direction D1, and domain walls DWa and DWb between the plurality of domains Da and Db. Each of the plurality of domains Da and Db may be a region of the magnetic track line MTL in which a magnetic moment or magnetic moments are aligned in a certain direction, and each of the domain walls DWa and DWb may be a region in which directions of magnetic moments are changed between adjacent two of the plurality of domains Da and Db. The domains Da and Db and the domain walls DWa and DWb may be alternately arranged in the first direction D1.

The plurality of domains Da and Db may include first domains Da arranged in the first direction D1 on the first region CLa of the conductive line CL, and second domains Db arranged in the first direction D1 on the second region CLb of the conductive line CL. Sizes and/or dimensions of the first domains Da may be different from sizes and/or dimensions of the second domains Db. The size of each of the second domains Db may be less than the size of each of the first domains Da. For example, as seen in FIG. 2, each of the first domains Da may have a first domain width WD1 in the first direction D1, and each of the second domains Db may have a second domain width WD2 in the first direction D1. The first domain width WD1 may be different from the second domain width WD2. The second domain width WD2 may be less than the first domain width WD1. In some embodiments, the first domains Da and the second domains Db may have substantially uniform dimensions in at least one direction (e.g., a length in the second direction D2, a thickness in the third direction D3)

A density of the first domains Da in the magnetic track line MTL may be different from a density of the second domains Db in the magnetic track line MTL. Here, the term 'density' may be defined as the number of domains existing in a unit region (e.g., a unit length) of the magnetic track line MTL. The density of the second domains Db in the magnetic track line MTL may be greater than the density of the first domains Da in the magnetic track line MTL. In other words, the second domains Db may be compressed more than the first domains Da in the magnetic track line MTL.

The domain walls DWa and DWb may include first domain walls DWa between the first domains Da on the first region CLa of the conductive line CL, and second domain walls DWb between the second domains Db on the second region CLb of the conductive line CL. A movement speed of the first domain walls DWa may be different from a movement speed of the second domain walls DWb in the magnetic track line MTL.

The second width W2 of the second region CLb of the conductive line CL may be greater than the first width W1 of the first region CLa of the conductive line CL, and in this case, when a current flows in the conductive line CL, a current density in the second region CLb of the conductive line CL may be less than a current density in the first region CLa of the conductive line CL. The movement speeds of the domain walls DWa and DWb in the magnetic track line MTL may be proportional to the density of the current flowing in the conductive line CL. Thus, the movement speed of the second domain walls DWb on the second region CLb of the conductive line CL may be slower than the movement speed of the first domain walls DWa on the first region CLa of the conductive line CL. Since the movement speed of the second domain walls DWb is slower than the movement speed of the first domain walls DWa in the magnetic track line MTL, the second domains Db may be compressed more than the first domains Da. As a result, the sizes of the second domains Db may be less than the sizes of the first domains Da, and for example, the second domain width WD2 of each of the second domains Db may be less than the first domain width WD1 of each of the first domains Da.

The magnetic track line MTL may include a magnetic element and may include at least one of, for example, cobalt (Co), iron (Fe), or nickel (Ni). In some embodiments, the magnetic track line MTL may have perpendicular magnetic anisotropy, in-plane magnetic anisotropy (IMA), antiferromagnetic anisotropy, synthetic antiferromagnetic anisotropy, or ferrimagnetic anisotropy. In some embodiments, the magnetic track line MTL may have perpendicular magnetic anisotropy, and each of the plurality of domains Da and Db may have a magnetization direction MD that is substantially perpendicular to an interface between the conductive line CL and the magnetic track line MTL. The magnetization directions MD of domains Da and Db, immediately adjacent to each other, of the plurality of domains Da and Db may be opposite to each other, and each of the domain walls DWa and DWb may define a boundary between the adjacent domains Da and Db having the magnetization directions MD opposite to each other. The magnetic track line MTL may include at least one of a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, or a perpendicular magnetic structure, as examples. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where 'n' denotes the number of bilayers. In some embodiments, the magnetic track line MTL may include CoFeB or a Co-based Heusler alloy.

Referring again to FIG. 1, the read/write unit 200 may be on the first domains Da of the magnetic track line MTL. The read/write unit 200 may vertically overlap (e.g., in the third direction D3) with a corresponding first domain Da of the first domains Da. The read/write unit 200 may vertically overlap (e.g., in the third direction D3) with the first region CLa of the conductive line CL. The read/write unit 200 may include, for example, a GMR sensor using a giant magneto resistance effect, a TMR sensor using a tunnel magneto resistance effect, or an AMR sensor using an anisotropy magneto resistance effect. The read/write unit 200 may be configured to write a bit into the corresponding first domain Da and/or to read a bit written in the corresponding first domain Da. The upper conductive line 250 may be electrically connected to the read/write unit 200. The upper conductive line 250 may include a conductive material and may include, for example, a metal (e.g., copper, tungsten, or aluminum) and/or a metal nitride (e.g., tantalum nitride, titanium nitride, or tungsten nitride).

According to the inventive concepts, the conductive line CL may include the first and second regions CLa and CLb having the widths W1 and W2 different from each other. The densities of the current flowing in the first and second regions CLa and CLb of the conductive line CL may be different from each other based on the widths W1 and W2 of the conductive line CL being different from each other (or by adjusting the widths W1 and W2 of the conductive line to be different from each other), and thus the movement speeds of the first and second domain walls DWa and DWb in the magnetic track line MTL may be different from each other and/or controlled to be different from each other. As a result, the domain widths WD1 and WD2 of the first and second domains Da and Db in the magnetic track line MTL may be different from each other and/or adjusted to be different from each other. For example, the movement speed of the second domain walls DWb on the second region CLb having a relatively larger width (e.g., the second width W2 of FIG. 3) may be slower than the movement speed of the first domain walls DWa on the first region CLa having a relatively smaller width (e.g., the first width W1 of FIG. 3). As a result, the second domain width WD2 of each of the second domains Db on the second region CLb may be less than the first domain width WD1 of each of the first domains Da on the first region CLa, and the second domains Db may be compressed more than the first domains Da in the magnetic track line MTL.

Thus, some aspects of the present disclosure may provide a magnetic memory device configured to control, or capable of controlling, movement speeds of domain walls in a magnetic track line, and configured to control, or capable of controlling, domain widths of domains in the magnetic track line.

In addition, according to the inventive concepts, the read/write unit 200 may be adjacent to the first domains Da which are relatively larger in size, and thus signal sensitivity of the read/write unit 200 may be improved. Furthermore, the magnetic track line MTL may include the second domains Db which are relatively smaller in size, and thus a density of data stored in the magnetic memory device may be increased.

FIGS. 5A to 5D are plan views illustrating a portion of the magnetic memory device of FIG. 1 to illustrate changes of movement speeds of domain walls and sizes of domains in the magnetic track line of FIG. 1.

Figure 5A:
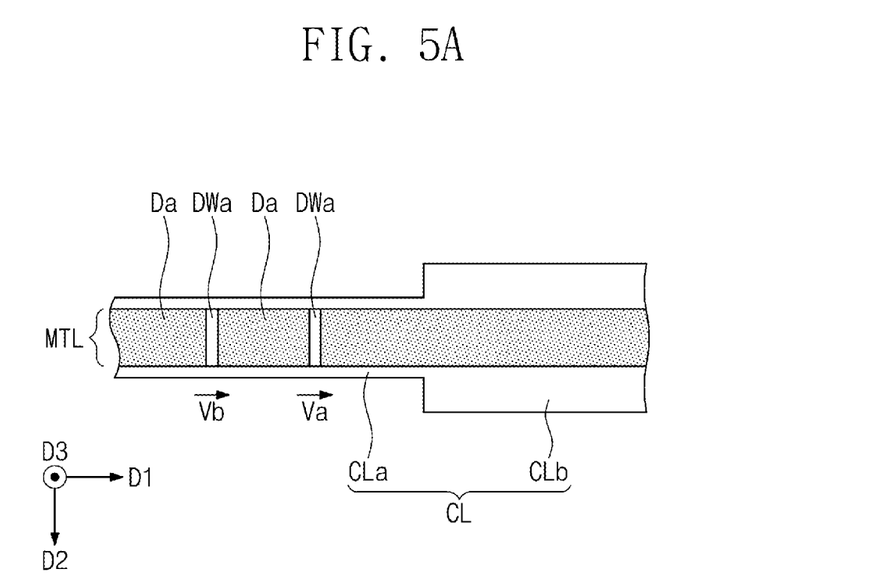
FIGS. 5A to 5D are plan views illustrating a portion of the magnetic memory device of FIG. 1 to illustrate changes of movement speeds of domain walls and sizes of domains in the magnetic track line of FIG. 1.

Referring to FIG. 5A, the magnetic track line MTL may include the first domains Da and the first domain walls DWa, which are provided on the first region CLa of the conductive line CL. A current may flow in the conductive line CL in a direction parallel or antiparallel to the first direction D1, and thus the first domain walls DWa may move in the first direction D1. Movement speeds of the first domain walls DWa may be equal to each other on the first region CLa of the conductive line CL (i.e., Va=Vb).

Figure 5B:
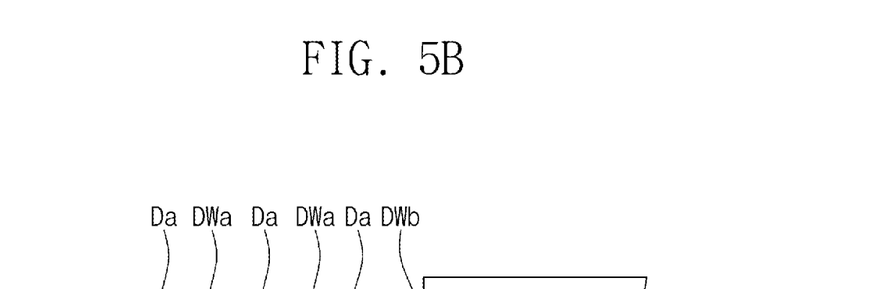

Referring to FIG. 5B, one of the first domain walls DWa may enter onto the second region CLb of the conductive line CL, and a movement speed Va' of the one of the first domain walls DWa may be reduced (Va'<Vb). The one of the first domain walls DWa entering onto the second region CLb may be referred to as a second domain wall DWb, and the movement speed Va' of the second domain wall DWb may be slower than movement speeds Vb and Vc of the first domain walls DWa (i.e., Va'<Vb, Va'<Vc). The current density in the second region CLb of the conductive line CL may be less than the current density in the first region CLa of the conductive line CL since the second region CLb of the conductive line CL has the width greater than that of the first region CLa of the conductive line CL as described with reference to FIG. 3, and thus the movement speed Va' of the second domain wall DWb may be slower than the movement speeds Vb and Vc of the first domain walls DWa. The movement speeds of the first domain walls DWa may be equal to each other on the first region CLa of the conductive line CL (i.e., Vb=Vc).

Figure 5C:
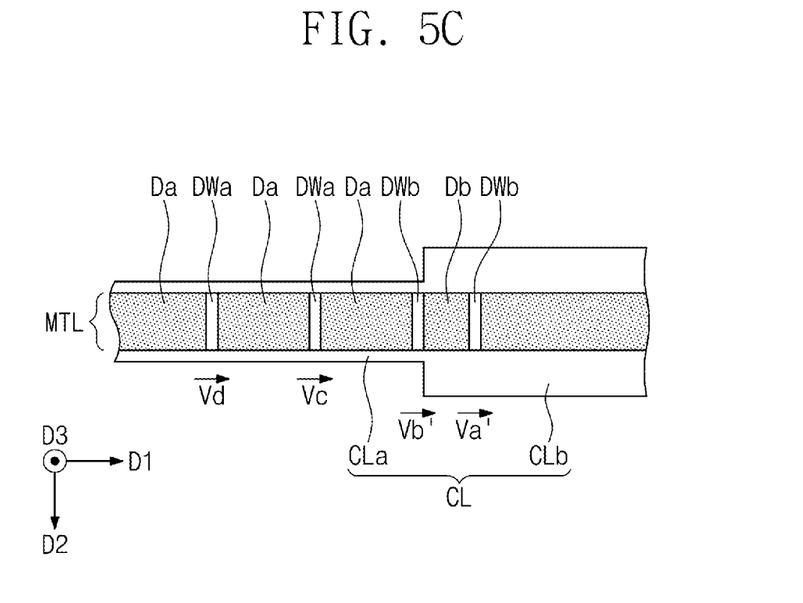

Referring to FIG. 5C, another of the first domain walls DWa may enter onto the second region CLb of the conductive line CL, and a movement speed Vb' of the other of the first domain walls DWa may be reduced (Vb'<Vc). The other of the first domain walls DWa entering onto the second region CLb may be referred to as an additional second domain wall DWb, and the movement speeds Va' and Vb' of the second domain walls DWb may be slower than movement speeds Vc and Vd of the first domain walls DWa (i.e., Va'<Vc, Va'<Vd'<Vc, Vb'<Vd). The movement speeds Va' and Vb' of the second domain walls DWb may be substantially equal to each other (Va'=Vb'), and the movement speeds Vc and Vd of the first domain walls DWa may be substantially equal to each other (Vc=Vd).

A second domain Db may be defined on the second region CLb of the conductive line CL by the second domain walls DWb. The second domain Db may be between the second domain walls DWb. Since the movement speeds Va' and Vb' of the second domain walls DWb on the second region CLb of the conductive line CL are slower than the movement speeds Vc and Vd of the first domain walls DWa on the first region CLa of the conductive line CL, a size of the second domain Db may be less than a size of each of the first domains Da.

Figure 5D:
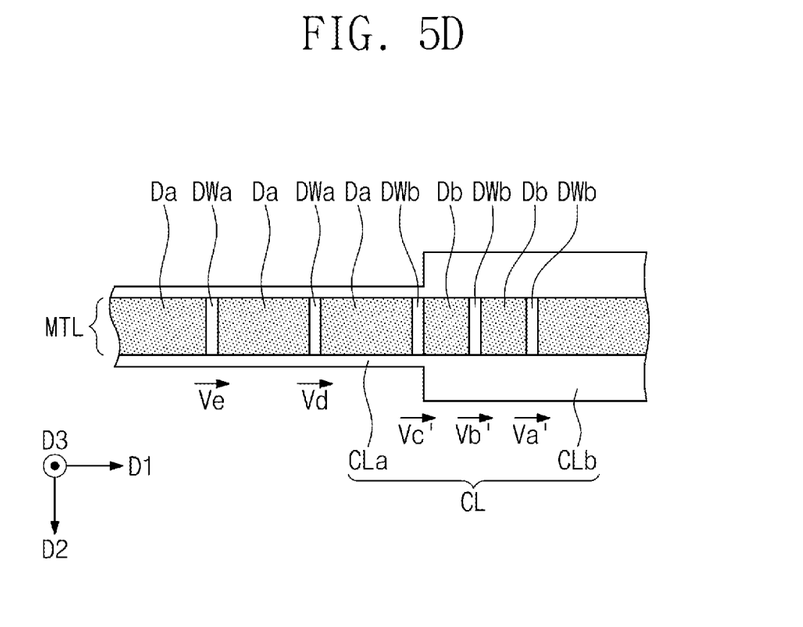

Referring to FIG. 5D, still another of the first domain walls DWa may enter onto the second region CLb of the conductive line CL, and a movement speed Vc' of the still other of the first domain walls DWa may be reduced (Vc'<Vd). The still other of the first domain walls DWa entering onto the second region CLb may be referred to as an additional second domain wall DWb, and the movement speeds Va', Vb' and Vc' of the second domain walls DWb may be slower than movement speeds Vd and Ve of the first domain walls DWa (i.e., Va'<Vd, Va'<Ve, Vb'<Vd, Vb'<Ve, Vc'<Vd, Vc'<Ve). The movement speeds Va', Vb' and Vc' of the second domain walls DWb may be substantially equal to each other (Va'=Vb'=Vc), and the movement speeds Vd and Ve of the first domain walls DWa may be substantially equal to each other (Vd=Ve).

A plurality of second domains Db may be defined on the second region CLb of the conductive line CL by the second domain walls DWb. The second domains Db may be between the second domain walls DWb. Since the movement speeds Va', Vb' and Vc' of the second domain walls DWb on the second region CLb of the conductive line CL are slower than the movement speeds Vd and Ve of the first domain walls DWa on the first region CLa of the conductive line CL, a size of each of the second domains Db may be less than a size of each of the first domains Da.

Figure 6:
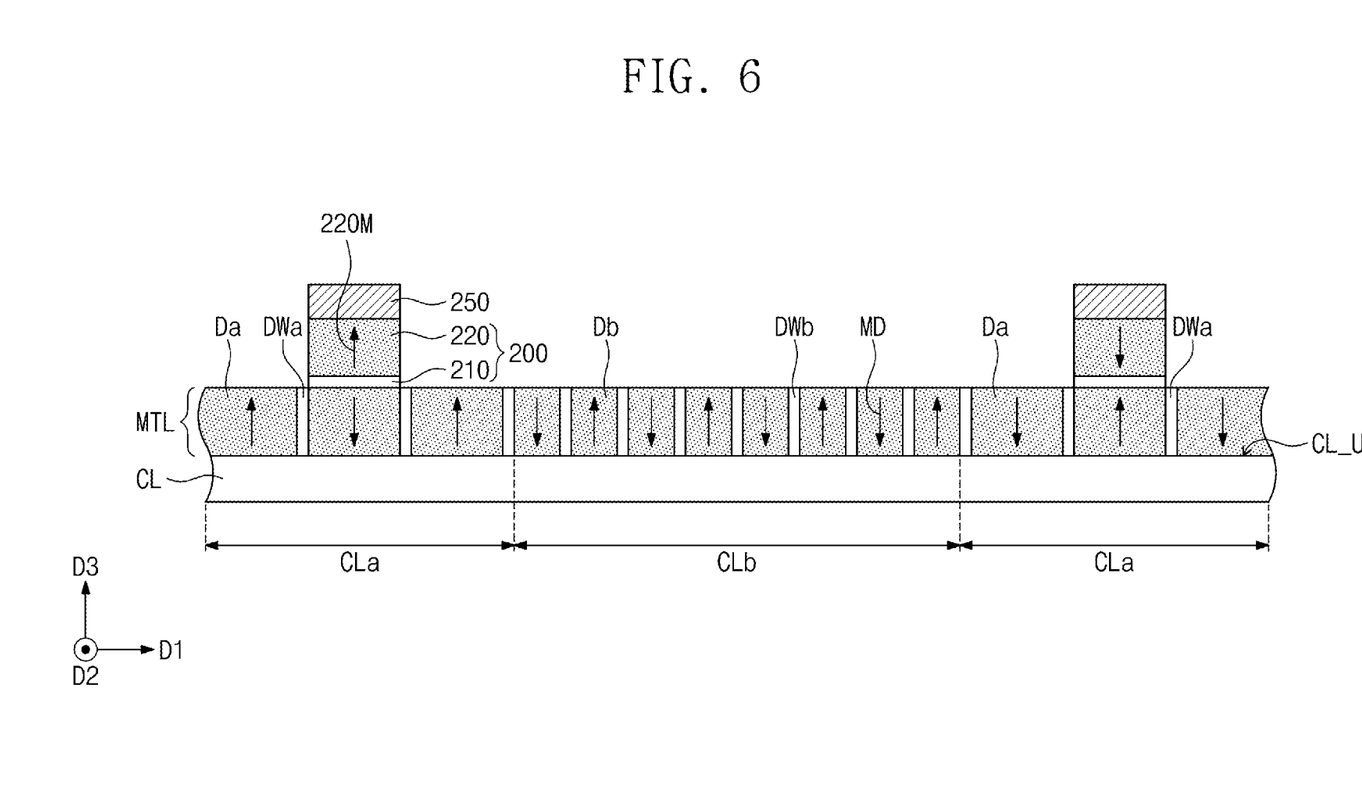
FIGS. 6 to 8 are side views illustrating magnetic memory devices according to some embodiments of the inventive concepts.

FIG. 6 is a side view illustrating a magnetic memory device according to some embodiments of the inventive concepts. Hereinafter, mainly differences between the embodiments described with reference to FIG. 6 and the embodiments described with reference to FIGS. 1 to 4 will be described and focused on for the purpose of ease and convenience in explanation.

Referring to FIG. 6, the read/write unit 200 may be on the first domains Da of the magnetic track line MTL. The read/write unit 200 may vertically overlap (e.g., in the third direction D3) with a corresponding first domain Da of the first domains Da and may vertically overlap (e.g., in the third direction D3) with the first region CLa of the conductive line CL.

In some embodiments, the read/write unit 200 may include a magnetic pattern 220 on the magnetic track line MTL, and a non-magnetic pattern 210 between the magnetic track line MTL and the magnetic pattern 220. The magnetic pattern 220 may be between the non-magnetic pattern 210 and the upper conductive line 250.

The magnetic pattern 220 may include at least one of cobalt (Co), iron (Fe), or nickel (Ni). In some embodiments, the magnetic pattern 220 may have perpendicular magnetic anisotropy (PMA). The magnetic pattern 220 may have a magnetization direction 220M that is substantially perpendicular to an interface between the magnetic pattern 220 and the non-magnetic pattern 210, and the magnetization direction 220M of the magnetic pattern 220 may be fixed in one direction. Magnetization directions MD of the first domains Da in the magnetic track line MTL may be changeable to be parallel or antiparallel to the magnetization direction 220M of the magnetic pattern 220. The magnetic pattern 220 may include at least one of a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where denotes the number of bilayers. In some embodiments, the magnetic pattern 220 may include CoFeB or a Co-based Heusler alloy.

In some embodiments, the read/write unit 200 may be a GMR sensor using a giant magneto resistance effect, and the non-magnetic pattern 210 may include a non-magnetic metal layer. In some embodiments, the read/write unit 200 may be a TMR sensor using a tunnel magneto resistance effect, and the non-magnetic pattern 210 may include a non-magnetic metal oxide layer and may include at least one of, for example, magnesium (Mg) oxide, titanium (Ti) oxide, aluminum (Al) oxide, magnesium-zinc (Mg—Zn) oxide, or magnesium-boron (Mg—B) oxide. The non-magnetic pattern 210 may be referred to as a tunnel barrier pattern.

Other components and features of magnetic memory devices according to the embodiments described with reference to FIG. 6 may be substantially the same as corresponding components and features of the magnetic memory device described with reference to FIGS. 1 to 4.

Figure 7:
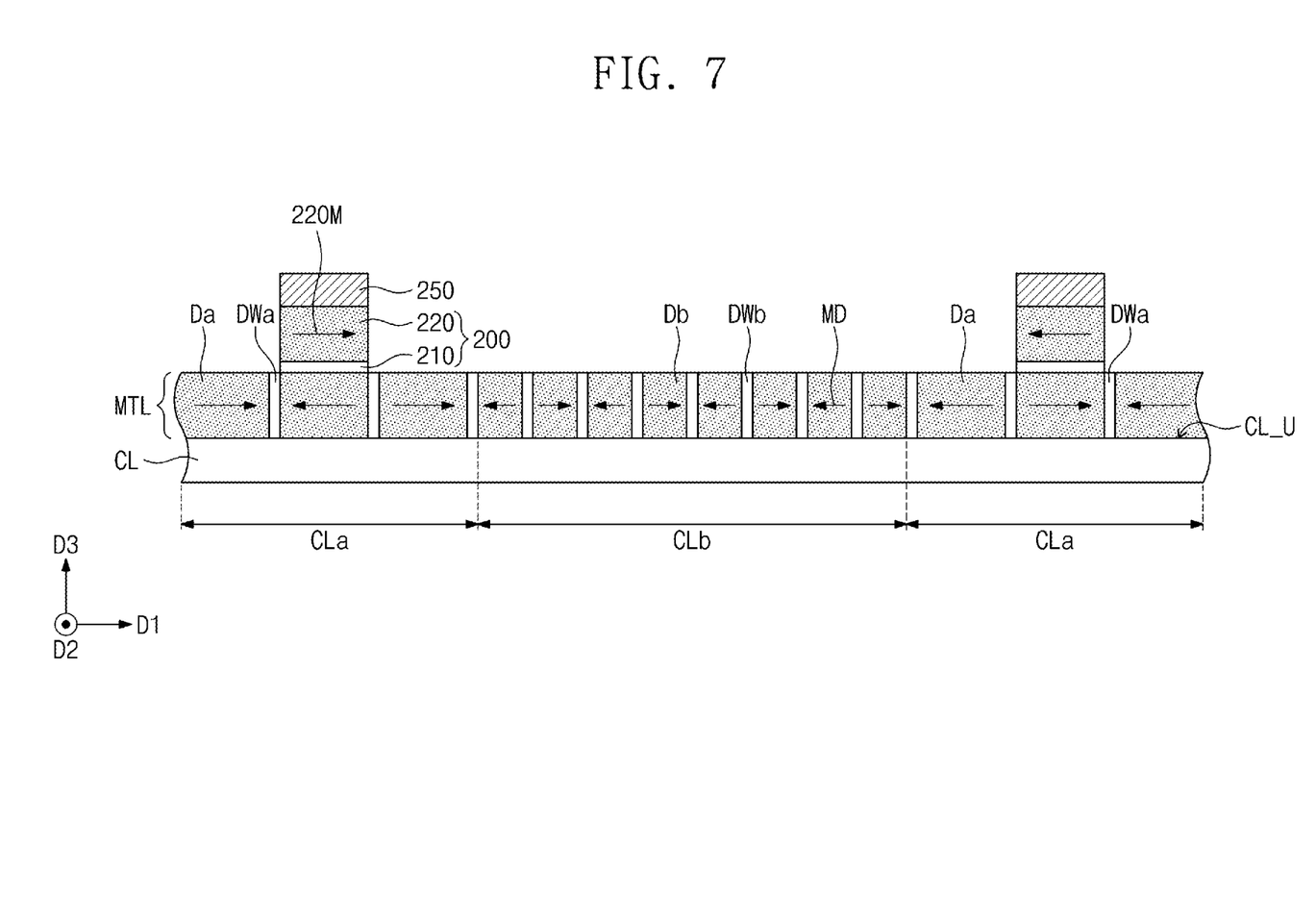

FIG. 7 is a side view illustrating a magnetic memory device according to some embodiments of the inventive concepts. Hereinafter, mainly differences between the embodiments described with reference to FIG. 7 and the embodiments described with reference to FIGS. 1 to 4 and 6 will be described and focused on for the purpose of ease and convenience in explanation.

Referring to FIG. 7, according to some embodiments, the magnetic track line MTL may have in-plane magnetic anisotropy (IMA), and each of the plurality of domains Da and Db may have a magnetization direction MD parallel to an interface between the conductive line CL and the magnetic track line MTL. The magnetization directions MD of domains Da and Db that are immediately adjacent to each other of the plurality of domains Da and Db may be opposite to each other, and each of the domain walls DWa and DWb may define a boundary between the adjacent domains Da and Db having the magnetization directions MD opposite to each other.

The magnetic pattern 220 of the read/write unit 200 may have in-plane magnetic anisotropy (IMA). The magnetic pattern 220 may have a magnetization direction 220M that is parallel to an interface between the magnetic pattern 220 and the non-magnetic pattern 210, and the magnetization direction 220M of the magnetic pattern 220 may be fixed in one direction. The magnetization directions MD of the first domains Da in the magnetic track line MTL may be changeable to be parallel or antiparallel to the magnetization direction 220M of the magnetic pattern 220.

In some embodiments, each of the magnetic track line MTL and the magnetic pattern 220 may include a ferromagnetic material, and the magnetic pattern 220 may further include an antiferromagnetic material for fixing a magnetization direction of the ferromagnetic material.

Other components and features of magnetic memory devices according to the embodiments described with reference to FIG. 7 may be substantially the same as corresponding components and features of the magnetic memory device described with reference to FIGS. 1 to 4 and 6.

Figure 8:
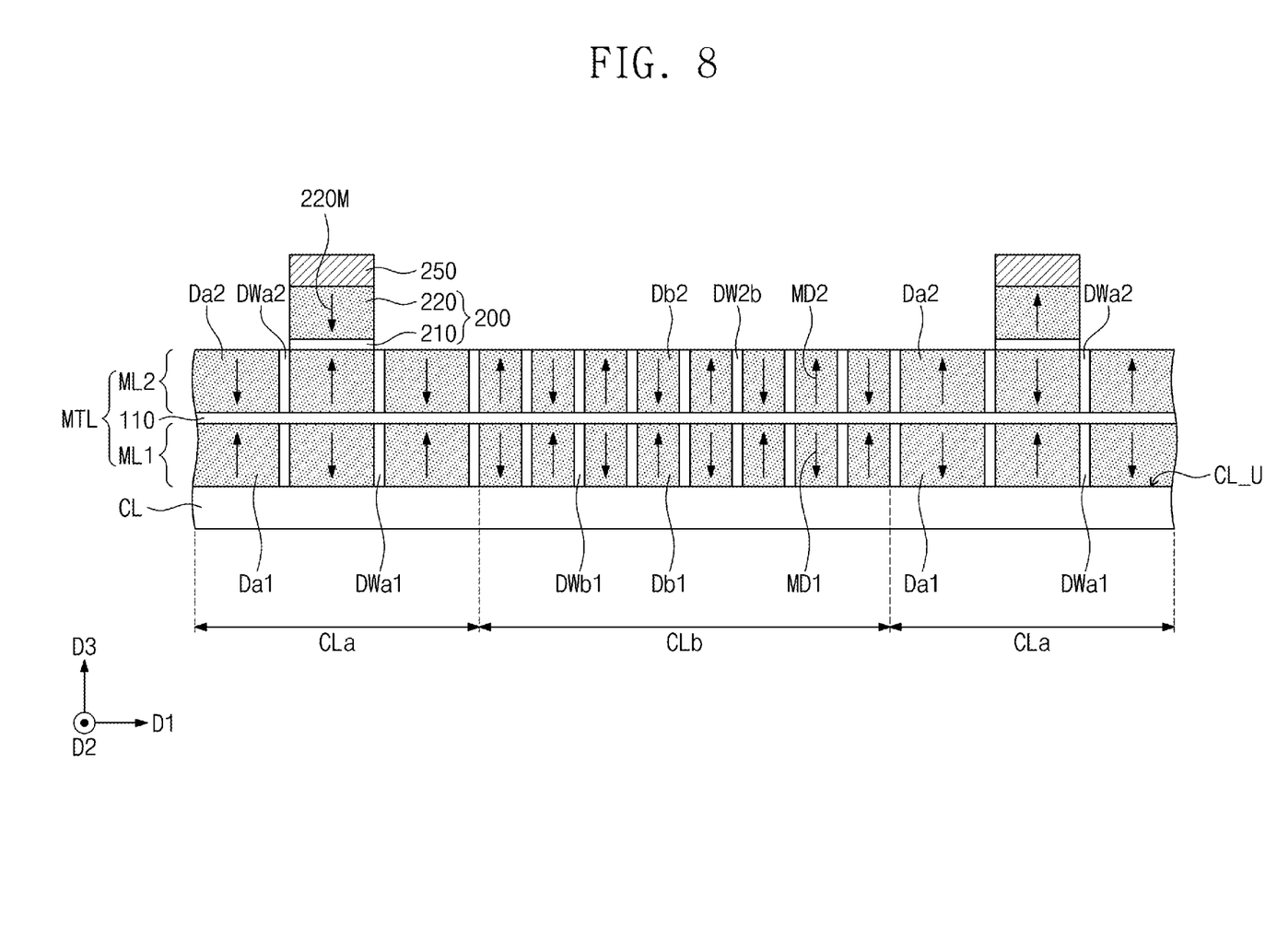

FIG. 8 is a side view illustrating a magnetic memory device according to some embodiments of the inventive concepts. Hereinafter, mainly differences between the embodiment described with reference to FIG. 8 and the embodiments described with reference to FIGS. 1 to 4, 6 and 7 will be described and focused on for the purpose of ease and convenience in explanation.

Referring to FIG. 8, the magnetic track line MTL may include a lower magnetic layer ML1, a spacer layer 110 and an upper magnetic layer ML2, which are sequentially stacked on the top surface CL_U of the conductive line CL. The lower magnetic layer ML1, the spacer layer 110 and the upper magnetic layer ML2 may be stacked on the top surface CL_U of the conductive line CL in the third direction D3. The lower magnetic layer ML1 may be between the conductive line CL and the spacer layer 110, and the spacer layer 110 may be between the lower magnetic layer ML1 and the upper magnetic layer ML2. The lower magnetic layer ML1, the spacer layer 110 and the upper magnetic layer ML2 may have line shapes extending in the first direction D1.

The lower magnetic layer ML1 may include a plurality of lower domains Da1 and Db1 arranged in the first direction D1, and lower domain walls DWa1 and DWb1 between the plurality of lower domains Da1 and Db1. The plurality of lower domains Da1 and Db1 may include first lower domains Da1 arranged in the first direction D1 on the first region CLa of the conductive line CL, and second lower domains Db1 arranged in the first direction D1 on the second region CLb of the conductive line CL. The lower domain walls DWa1 and DWb1 may include first lower domain walls DWa1 between the first lower domains Da1 on the first region CLa of the conductive line CL, and second lower domain walls DWb1 between the second lower domains Db1 on the second region CLb of the conductive line CL. The plurality of lower domains Da1 and Db1 and the lower domain walls DWa1 and DWb1 may be substantially the same as the plurality of domains Da and Db and the domain walls DWa and DWb, described with reference to FIGS. 1 to 4. A size of each of the first lower domains Da1 may be different from a size of each of the second lower domains Db1, and for example, the size of each of the second lower domains Db1 may be less than the size of each of the first lower domains Da1. A movement speed of the first lower domain walls DWa1 may be different from a movement speed of the second lower domain walls DWb1 in the lower magnetic layer ML1, and for example, the movement speed of the second lower domain walls DWb1 on the second region CLb of the conductive line CL may be slower than the movement speed of the first lower domain walls DWa1 on the first region CLa of the conductive line CL.

The upper magnetic layer ML2 may include a plurality of upper domains Da2 and Db2 arranged in the first direction D1, and upper domain walls DWa2 and DWb2 between the plurality of upper domains Da2 and Db2. The plurality of upper domains Da2 and Db2 may include first upper domains Da2 arranged in the first direction D1 on the first region CLa of the conductive line CL, and second upper domains Db2 arranged in the first direction D1 on the second region CLb of the conductive line CL. The upper domain walls DWa2 and DWb2 may include first upper domain walls DWa2 between the first upper domains Da2 on the first region CLa of the conductive line CL, and second upper domain walls DWb2 between the second upper domains Db2 on the second region CLb of the conductive line CL. The plurality of upper domains Da2 and Db2 and the upper domain walls DWa2 and DWb2 may be substantially the same as the plurality of domains Da and Db and the domain walls DWa and DWb, described with reference to FIGS. 1 to 4. A size of each of the first upper domains Da2 may be different from a size of each of the second upper domains Db2, and for example, the size of each of the second upper domains Db2 may be less than the size of each of the first upper domains Da2. A movement speed of the first upper domain walls DWa2 may be different from a movement speed of the second upper domain walls DWb2 in the upper magnetic layer ML2, and for example, the movement speed of the second upper domain walls DWb2 on the second region CLb of the conductive line CL may be slower than the movement speed of the first upper domain walls DWa2 on the first region CLa of the conductive line CL.

The plurality of upper domains Da2 and Db2 may vertically overlap with the plurality of lower domains Da1 and Db1 in the third direction D3, respectively. The first upper domains Da2 may vertically overlap with the first lower domains Da1 in the third direction D3 on the first region CLa of the conductive line CL, and the second upper domains Db2 may vertically overlap with the second lower domains Db1 in the third direction D3 on the second region CLb of the conductive line CL.

The lower magnetic layer ML1 and the upper magnetic layer ML2 may be antiferromagnetically coupled to each other by the spacer layer 110. Each of the first upper domains Da2 may be antiferromagnetically coupled to a corresponding first lower domain Da1 of the first lower domains Da1 on the first region CLa of the conductive line CL, and each of the second upper domains Db2 may be antiferromagnetically coupled to a corresponding second lower domain Db1 of the second lower domains Db1 on the second region CLb of the conductive line CL.

Each of the lower magnetic layer ML1 and the upper magnetic layer ML2 may have perpendicular magnetic anisotropy. In this case, each of the plurality of lower domains Da1 and Db1 and the plurality of upper domains Da2 and Db2 may have a magnetization direction MD1 or MD2 substantially perpendicular to an interface between the lower magnetic layer ML1 and the spacer layer 110. Each of the plurality of upper domains Da2 and Db2 may be antiferromagnetically coupled to each of the plurality of lower domains Da1 and Db1 by the spacer layer 110, and thus a magnetization direction MD2 of each of the plurality of upper domains Da2 and Db2 may be antiparallel to a magnetization direction MD1 of each of the plurality of lower domains Da1 and Db1. Each of the lower magnetic layer ML1 and the upper magnetic layer ML2 may include the perpendicular magnetic material or the perpendicular magnetic structure, described with reference to FIGS. 1 to 4. In certain embodiments, each of the lower magnetic layer ML1 and the upper magnetic layer ML2 may have in-plane magnetic anisotropy, as described with reference to FIG. 7.

The spacer layer 110 may include a non-magnetic metal and may include, for example, ruthenium (Ru), iridium (Ir), tungsten (W), tantalum (Ta), or an alloy thereof.

Other components and features of magnetic memory devices according to the embodiments described with reference to FIG. 8 may be substantially the same as corresponding components and features of the magnetic memory device described with reference to FIGS. 1 to 4, 6 and 7.

Figure 9:
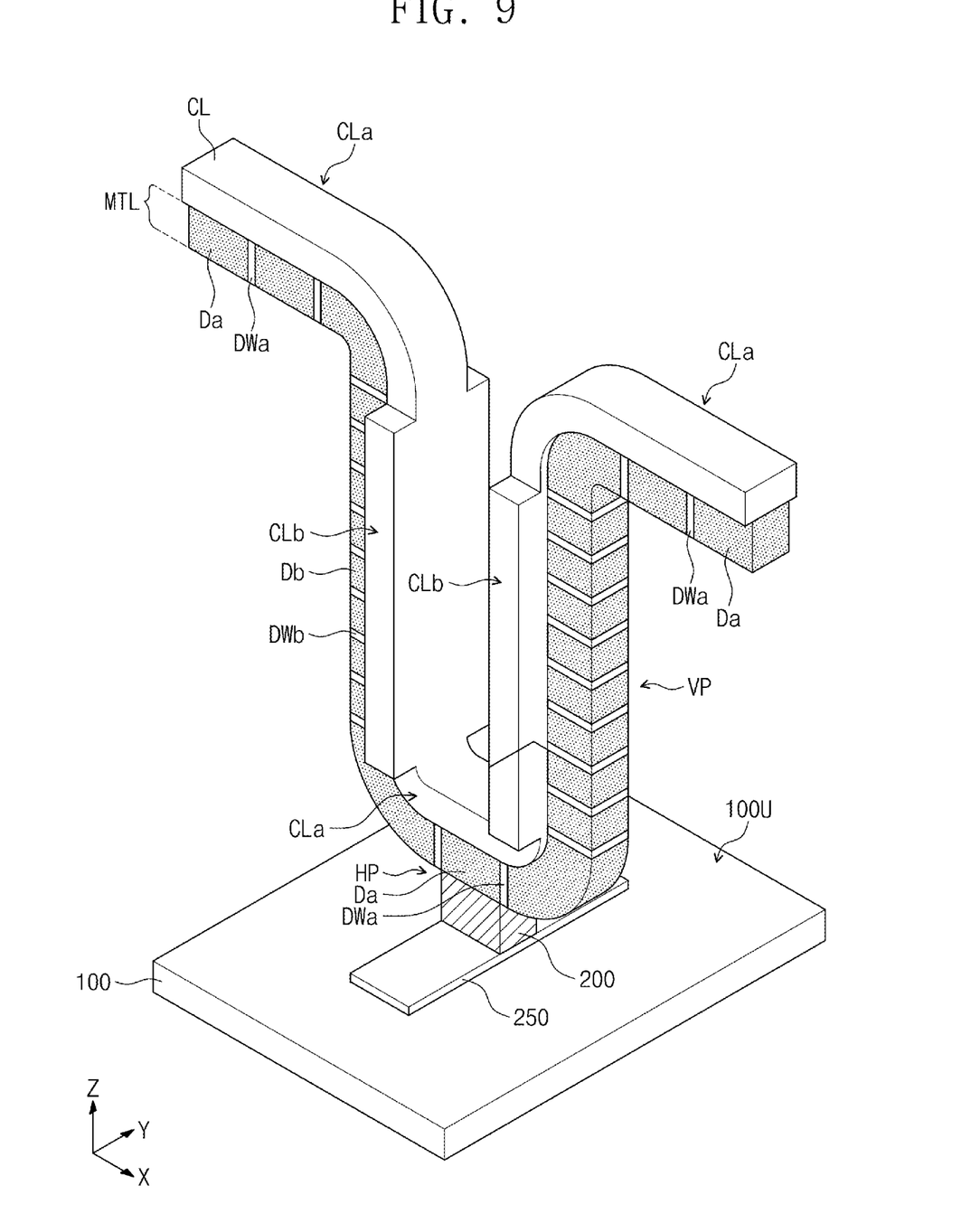
FIGS. 9 and 10 are perspective views illustrating magnetic memory devices according to some embodiments of the inventive concepts.
Figure 10:
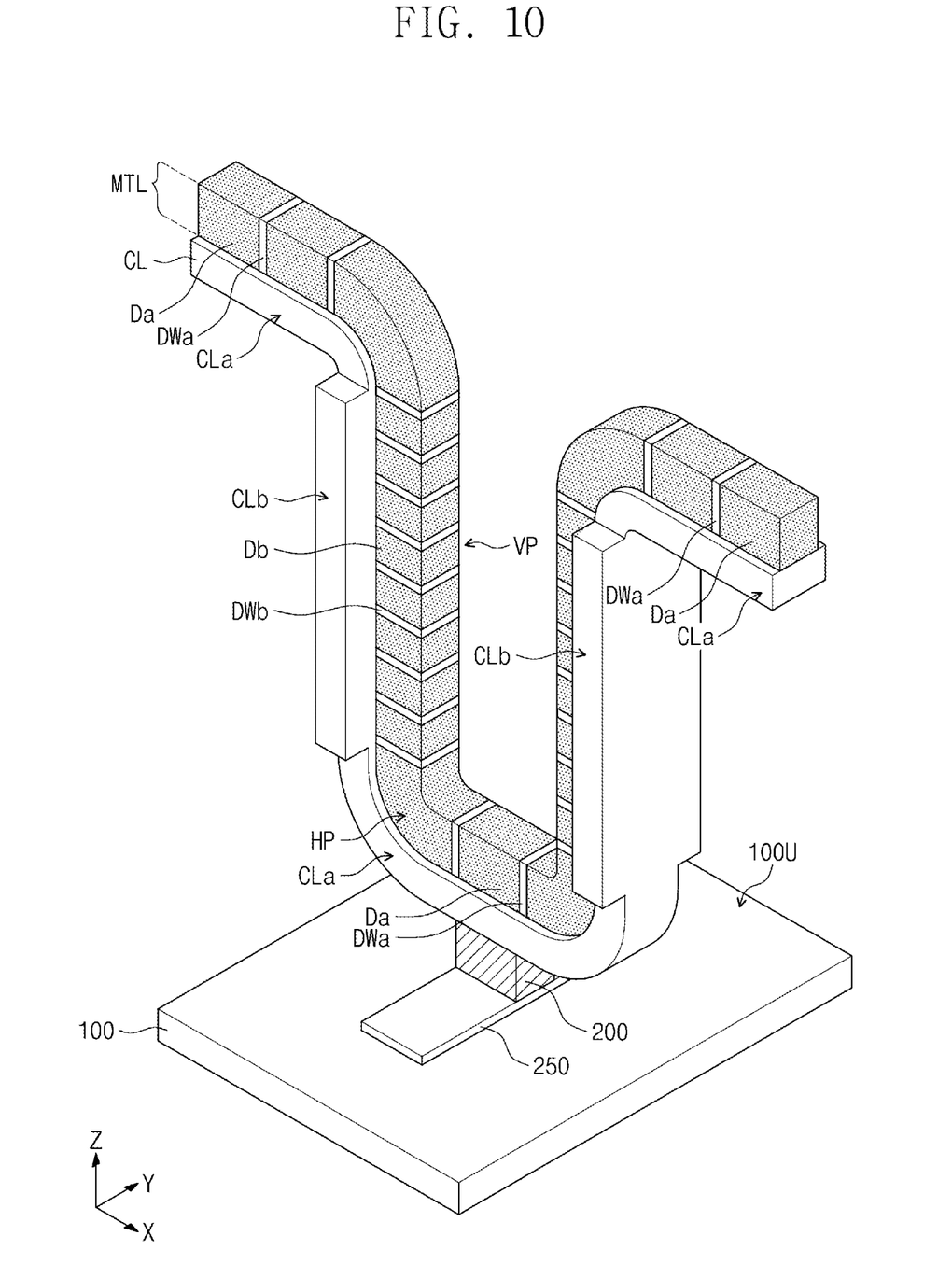

FIGS. 9 and 10 are perspective views illustrating magnetic memory devices according to some embodiments of the inventive concepts. Hereinafter, mainly differences between the embodiments described with reference to FIGS. 9 and 10 and the embodiments described with reference to FIGS. 1 to 4 will be described and focused on for the purpose of ease and convenience in explanation.

Referring to FIGS. 9 and 10, each of the conductive line CL and the magnetic track line MTL may have a U-shape. The magnetic track line MTL may include a vertical portion VP extending in a direction (e.g., a Z-direction) perpendicular to a top surface 100U of a substrate 100, and a horizontal portion HP extending in a direction (e.g., an X-direction) parallel to the top surface 100U of the substrate 100. The first region CLa of the conductive line CL may be adjacent to the horizontal portion HP of the magnetic track line MTL, and the second region CLb of the conductive line CL may be adjacent to the vertical portion VP of the magnetic track line MTL.

The first region CLa of the conductive line CL may have the first width W1 which is relatively small or smaller, and thus the horizontal portion HP of the magnetic track line MTL may include the first domains Da having the first domain widths WD1 which are relatively large or larger. The second region CLb of the conductive line CL may have the second width W2 which is relatively larger, and thus the vertical portion VP of the magnetic track line MTL may include the second domains Db having the second domain widths WD2 which are relatively smaller. The read/write unit 200 may be on the horizontal portion HP of the magnetic track line MTL and may be adjacent to the first domains Da.

In some embodiments, as illustrated in FIG. 9, the magnetic track line MTL may be between the substrate 100 and the conductive line CL. The conductive line CL may extend along an inner surface of the magnetic track line MTL having the U-shape. In some embodiments, as illustrated in FIG. 10, the conductive line CL may be between the substrate 100 and the magnetic track line MTL. The conductive line CL may extend along an outer surface of the magnetic track line MTL having the U-shape.

According to some example embodiments of the inventive concepts, the conductive line may include the first and second regions having the widths different from each other. The widths of the conductive line may be different from each other and/or may be adjusted to be different from each other, and thus the densities of the currents flowing in the first and second regions of the conductive line may be different from each other and/or may be adjusted to be different from each other. Therefore, the movement speeds of the first and second domain walls in the magnetic track line on the conductive line may be controlled to be different from each other. As a result, the sizes of the first and second domains in the magnetic track line may be different from each other and/or adjusted to be different from each other. Thus, some aspects of the present disclosure provide magnetic memory devices configured to control, or capable of controlling, movement speeds of domain walls in a magnetic track line, and configured to control, or capable of controlling, sizes of domains in the magnetic track line.

While some example embodiments of the inventive concepts have been particularly shown and described, it will be understood by those of ordinary skill in the art that variations in form and detail may be made therein without departing from the scope of the attached claims.

What is claimed is:

1. A magnetic memory device comprising:
a conductive line that extends in a first direction; and
a magnetic track line that extends in the first direction along a top surface of the conductive line,
wherein the conductive line includes: a first region having a first width in a second direction; and a second region having a second width in the second direction, the first direction and the second direction parallel to the top surface of the conductive line and perpendicular to each other, and the second width greater than the first width,
wherein the magnetic track line comprises: first domains arranged in the first direction on the first region of the conductive line; and second domains arranged in the first direction on the second region of the conductive line, and
wherein a size of each of the second domains is less than a size of each of the first domains.

2. The magnetic memory device of claim 1, wherein each of the first domains has a first domain width in the first direction, wherein each of the second domains has a second domain width in the first direction, and wherein the second domain width is less than the first domain width.

3. The magnetic memory device of claim 1, wherein the magnetic track line comprises: first domain walls between the first domains; and second domain walls between the second domains, and
wherein, when a current flows in the conductive line, a movement speed of the second domain walls is less than a movement speed of the first domain walls.

4. The magnetic memory device of claim 1, wherein a density of the second domains in the magnetic track line is greater than a density of the first domains in the magnetic track line.

5. The magnetic memory device of claim 1, wherein the conductive line is configured to generate spin-orbit torque by a current flowing therein.

6. The magnetic memory device of claim 1, further comprising:
a read/write unit on the magnetic track line,
wherein the read/write unit is on the first domains.

7. The magnetic memory device of claim 6, wherein the magnetic track line is between the conductive line and the read/write unit, and
wherein the read/write unit vertically overlaps with the first region of the conductive line.

8. The magnetic memory device of claim 6, wherein the read/write unit comprises a tunnel magneto resistance sensor or a giant magneto resistance sensor.

9. The magnetic memory device of claim 6, wherein the read/write unit comprises: a magnetic pattern on the magnetic track line; and a non-magnetic pattern between the magnetic track line and the magnetic pattern.

10. The magnetic memory device of claim 1, wherein the conductive line has a thickness in a third direction perpendicular to the top surface of the conductive line, and
wherein a thickness of the first region of the conductive line is substantially equal to a thickness of the second region of the conductive line.

11. A magnetic memory device comprising:
a conductive line; and
a magnetic track line that extends along one surface of the conductive line,
wherein the conductive line has a width in a direction which is parallel to the one surface of the conductive line and is perpendicular to an extension direction of the magnetic track line and the conductive line,
wherein the conductive line includes: a first region having a first width; and a second region having a second width different from the first width,
wherein the magnetic track line comprises: first domains adjacent to the first region of the conductive line; and second domains adjacent to the second region of the conductive line, and
wherein a size of each of the first domains is different from a size of each of the second domains.

12. The magnetic memory device of claim 11, wherein each of the conductive line and the magnetic track line has a U-shape,
wherein the magnetic track line includes: a vertical portion that extends in a direction perpendicular to a top surface of a substrate; and a horizontal portion that extends in parallel to the top surface of the substrate, and
wherein the first region of the conductive line is adjacent to the horizontal portion of the magnetic track line, and the second region of the conductive line is adjacent to the vertical portion of the magnetic track line.

13. The magnetic memory device of claim 12, wherein the first domains and the second domains are arranged in the magnetic track line along the extension direction of the magnetic track line.

14. The magnetic memory device of claim 13, wherein the second width is greater than the first width, and
wherein the size of each of the second domains is less than the size of each of the first domains.

15. The magnetic memory device of claim 14, further comprising:
a read/write unit on the magnetic track line,
wherein the read/write unit is on the first domains.

16. The magnetic memory device of claim 13, wherein each of the first domains has a first domain width in the extension direction of the magnetic track line, and each of the second domains has a second domain width in the extension direction of the magnetic track line, and
wherein the first domain width is different from the second domain width.

17. The magnetic memory device of claim 16, wherein the second width is greater than the first width, and
wherein the second domain width is less than the first domain width.

18. The magnetic memory device of claim 13, wherein the magnetic track line comprises: first domain walls between the first domains; and second domain walls between the second domains, and
wherein, when a current flows in the conductive line, a movement speed of the first domain walls is different from a movement speed of the second domain walls.

19. The magnetic memory device of claim 18, wherein the second width is greater than the first width, and
wherein the movement speed of the second domain walls is less than the movement speed of the first domain walls.

20. The magnetic memory device of claim 12, wherein the conductive line is configured to generate spin-orbit torque by a current flowing therein.

\* \* \* \* \*